(12) United States Patent
Ohlhoff

(10) Patent No.: US 7,120,841 B2
(45) Date of Patent: Oct. 10, 2006

(54) DATA GENERATOR FOR GENERATING TEST DATA FOR WORD-ORIENTED SEMICONDUCTOR MEMORIES

(75) Inventor: Carsten Ohlhoff, München (DE)

(73) Assignee: Infineon Technologies AG, Munich (DE)

( * ) Notice: Subject to any disclaimer, the term of this patent is extended or adjusted under 35 U.S.C. 154(b) by 397 days.

(21) Appl. No.: 10/200,633

(22) Filed: Jul. 22, 2002

(65) Prior Publication Data

US 2003/0018934 A1   Jan. 23, 2003

(30) Foreign Application Priority Data

Jul. 20, 2001   (DE) ................. 101 35 583

(51) Int. Cl.
*G11C 29/00* (2006.01)
*G01R 31/28* (2006.01)
*G06F 11/00* (2006.01)

(52) U.S. Cl. ...................... 714/718; 714/738

(58) Field of Classification Search ........ 714/718–723, 714/738, 739
See application file for complete search history.

(56) References Cited

U.S. PATENT DOCUMENTS

| | | | |
|---|---|---|---|
| 5,033,048 A * | 7/1991 | Pierce et al. ................. | 714/719 |
| 5,258,986 A * | 11/1993 | Zerbe .......................... | 714/719 |
| 5,659,551 A | 8/1997 | Huott et al. | |
| 6,014,336 A * | 1/2000 | Powell et al. ................ | 365/201 |
| 6,477,676 B1 * | 11/2002 | Rhodes et al. .............. | 714/743 |
| 2002/0194558 A1 * | 12/2002 | Wang et al. ................. | 714/718 |

FOREIGN PATENT DOCUMENTS

| | | |
|---|---|---|
| EP | 0 366 757 B1 | 5/1990 |
| WO | WO 89/09471 | 10/1989 |

* cited by examiner

*Primary Examiner*—Guy Lamarre
*Assistant Examiner*—John J. Tabone, Jr.
(74) *Attorney, Agent, or Firm*—Laurence A. Greenberg; Werner H. Stemer; Ralph E. Locher

(57) ABSTRACT

A data generator for generating test data for a word-oriented semiconductor memory is integrated on a semiconductor chip of the semiconductor memory. The data generator has a shift register.

9 Claims, 2 Drawing Sheets

DATA GENERATOR FOR GENERATING TEST DATA FOR WORD-ORIENTED SEMICONDUCTOR MEMORIES

BACKGROUND OF THE INVENTION

Field of the Invention

The invention lies in the semiconductor technology field. More specifically, the present invention relates to a data generator for generating test data—organized in data words—for a word-oriented semiconductor memory. The invention is particularly suitable for use in a dynamic random access memory (DRAM).

In the context of this application, a word-oriented semiconductor memory is to be understood to be a semiconductor memory in which, upon application of a memory address, a plurality of data bits in the form of a data word are read into the semiconductor memory, or out from the latter, in parallel via a plurality of data lines. Modern word-oriented semiconductor memories such as, for example, dynamic random access memories (DRAM) have word lengths of typically 4, 8 or 16 bits and correspondingly 4, 8 or 16 data lines.

A semiconductor memory typically has M×N memory cells arranged in an array of M columns and N rows. In addition, the memory cells in an n bit word-oriented semiconductor memory are combined in data segments comprising n memory cells.

The memory cells of a data segment are often addressed via a common word line (WL). In this case, the number of memory cells which are addressed via a word line and are arranged e.g. in a row is an integer multiple of the word width n. The row is addressed externally by specification of a row address x, which corresponds to the selection of the word line assigned to the row.

Within a data segment, the n individual memory cells are addressed via n different bit lines. However, all n memory cells of the data segment are externally addressed simultaneously by the specification of a column address y via n external data lines (DQ "data query", d0 to dn-1). The specification of an x-y memory address thus addresses an entire data segment comprising n memory cells.

The y-addressing has the effect that the content of the n external data lines, namely a data word having a width of n bits, is written to the data segment at the address x-y, or read out, by means of a multiplex method. Under an address x-y, each data line 0 to n-1 is assigned exactly one memory cell within the addressed data segment.

The n memory cells of a data segment are generally arranged spatially adjacent in the semiconductor memory. Equally, the n bit lines via which the n memory cells of the data segment are addressed are generally arranged adjacent. Consequently, on account of production defects, it is possible not only for malfunctions to occur which are caused solely due to defective individual memory cells or leads. Precisely because of the high integration density and the organization of the memory cells in data segments, it is possible for undesirable interactions to occur, such as e.g. short circuits between adjacent bit lines or memory cells and/or e.g. capacitive crosstalk between adjacent bit lines, which impair the entirely satisfactory functioning of the data segment or adjacent data segments and thus of the entire semiconductor memory.

In order to check the fabricated semiconductor memories for entirely satisfactory functioning, said memories are subject to complex test methods. Hitherto, semiconductor memories fabricated on an industrial scale have generally been tested for possible production defects by means of an external test system only after their completion.

In order to test an n bit word-oriented semiconductor memory, a data word having a width of n bits is generated in a data generator. An address generator an x-y address for addressing an n bit data segment, into which the data word generated is read. Data generator and address generator are parts of the test system in this case.

In the subsequent step, the content of the data segment is read out and compared with the data word originally read in. In this case, a multiplicity of different data patterns are required in order to test all the cells of a data segment for possible malfunctions.

Furthermore, interactions between individual cells or bit lines can occur, which adversely influence the memory reliability. By means of suitable data patterns, all the memory cells of a data segment can be checked for such interactions.

The data patterns required for testing can either be read out from a preprogrammed static register, or be generated by means of an algorithmic data generator. Algorithmic data generators of the kind implemented nowadays in typical test systems have the advantage that they can be flexibly adapted to the architecture of the semiconductor memory to be tested.

Interactions between individual data segments can be tested by testing the write/read accuracy of one data segment against a changing data background in the other data segments. Through systematic variation of the data background, it is possible to track undesirable interactions between individual data segments. Interactions between different memory cells or bit lines within a data segment can be tested by varying n bits within the data word.

The above-described test method with an external test system is subject to the disadvantage that the external test system has to provide all the input signals (test data with addressing) for each semiconductor memory to be tested. A multiplicity of test channels are required for that purpose. Corresponding test systems require high capital expenditure, their costs scaling with the number of test channels required.

SUMMARY OF THE INVENTION

It is accordingly an object of the invention to provide a data generator for generating test data for word-oriented semiconductor memories, which overcomes the above-mentioned disadvantages of the heretofore-known devices and methods of this general type and which reduces the number of test channels of an external test system that are required per semiconductor memory tested.

With the foregoing and other objects in view there is provided, in accordance with the invention, a testing device for testing a word-oriented semiconductor memory integrated on a chip. The testing device comprises:

a data generator for generating test data commonly integrated on the semiconductor chip and connected to the semiconductor memory, and said data generator including a shift register.

In other words, the objects of the invention are achieved by a data generator with the above features. The data generator for generating test words for a word-oriented semiconductor memory is not formed as an external data generator which is part of a complex test system with which a multiplicity of semiconductor memories can be tested simultaneously. According to the invention, the data generator is instead integrated as part of a test logic such as e.g.

of a BIST ("built-in self-test") controller on the semiconductor chip of the semiconductor memory. The number of test channels required for each chip to be tested in an external test system that is still required can be drastically reduced as a result of this. The integration of the data generator into the semiconductor memory itself that is to be tested makes it possible to replace the test data generation on an external test system. This allows a significantly higher number of semiconductor memories to be tested in parallel for a given test system, as a result of which corresponding cost advantages are realized.

The integration of the data generator into the semiconductor memory furthermore allows the data generator to be optimally adapted to the architecture of the semiconductor memory to be tested. In contrast to this, an external data generator which is generally part of a test system with further constituent parts such as an address generator, for example, must always be designed in a highly universal fashion, since it has to be suitable for generating test algorithms for a wide variety of semiconductor memories.

Even though the data generator according to the invention, on account of its integration into the semiconductor chip of the semiconductor memory, can be optimally adapted to the memory architecture to be tested, the data generator nevertheless increases the number of functional elements which are required at the very least and must additionally be accommodated on the semiconductor chip besides the memory cells. Since modern semiconductor memories generally realize extremely high integration densities, the data generator is therefore advantageously to be designed in such a way that it manages with a minimum amount of functional elements. It is necessary, then, to strive for an optimum between the functional scope of the data generator and the chip area required for this.

For this purpose, the data generator according to the invention has a shift register. A specific data pattern is read into this shift register at the beginning of a test sequence and is algorithmically manipulated in the course of the test program in order to generate a multiplicity of different data patterns in the shift register. n bits of the shift register content can be read via n data lines DQ into the semiconductor memory data segments to be tested. In the subsequent method step, the content of the memory cells of the data segment to be tested is read out and the data word read out is compared with the data word originally read in.

The data generator according to the invention with a shift register enables flexible data generation and thereby avoids possible limitations in the test coverage.

Generally, the addressing of the data word having a width of n bits which is generated by the data generator according to the invention is generated by an address generator which, for example in the context of a predetermined algorithm, generates the addresses of data segments to be tested, which are to be tested during the test sequence individually and preferably also for possible interactions with other data segments. This address generator can be realized as an external address generator, that is say be arranged outside the semiconductor memory itself, or else likewise be integrated onto the semiconductor chip of the semiconductor memory besides the data generator.

The length S of the shift register is essentially freely selectable; its minimum length is prescribed by the word width n of the data word to be generated. The length S of the shift register will advantageously always be an integer multiple of the length n of the data word.

If the length S of the shift register exceeds the length n of the data word to be generated, then for the generation of a data word only a subset of n data bits from the shift register content comprising S data bits is read out onto the n data lines of the semiconductor memory. This can be done for example by means of a selection unit which selects a subset of n bits from the S data bits of the shift register. This selection unit can be controlled algorithmically. However, in a simpler configuration, it can also be driven via one to a plurality of control lines in such a way that, in the presence of a specific data pattern on the control lines, specific, fixedly predetermined data bits are always selected from the shift register. A corresponding selection unit is explained in more detail in the context of the exemplary embodiment.

In accordance with an advantageous development of the data generator according to the invention, the data generator comprises a memory unit which is provided for receiving a start data pattern for the shift register. As described above, a start data pattern is read into the shift register at the beginning of a test sequence. As an alternative, the start data word can be programmed externally before the test to be executed, e.g. via a serial data path.

This start data pattern is then manipulated algorithmically in order to generate the required test data. In this case, the start data pattern is advantageously adapted on the one hand to the architecture of the data segment to be tested and on the other hand to the size of the shift register and the type of the algorithmic control of the latter.

Particular advantages are afforded if the memory of the memory unit is embodied as a nonvolatile memory. A suitable start data pattern can then be stored in this nonvolatile memory and be retrieved from the latter for the performance of a test. Furthermore, it is advantageous if the memory unit is designed in such a way that new start data patterns can be repeatedly stored in the memory unit in the course of a test program.

The present invention further relates to a word-oriented semiconductor memory on a semiconductor chip. According to the invention, this semiconductor memory comprises a BIST controller, which is integrated onto the semiconductor chip and in turn has a data generator for generating test data as outlined above.

Such a semiconductor memory can be tested in a simple manner for entirely satisfactory functioning of all the data segments, since, depending on the design of the BIST controller, for a test, contact has to be made with only very few external connections, i.e. only few channels of an external test system are occupied. This affords enormous cost advantages in industrial scale production of semiconductor memories.

Furthermore, the test logic integrated in the form of a BIST controller onto the semiconductor chip affords the advantage that the semiconductor memory according to the invention can also be tested for entirely satisfactory functionality of all the data segments even after its production, for example while it is being used by the end customer. In this case, the BIST controller can be controlled algorithmically with simple means e.g. by means of a program code which is executed in the machine in which the semiconductor memory is used.

Further advantages are afforded if the BIST controller has an address generator, which generates the addresses required for the test of the semiconductor memory.

As an alternative to this, the addressing of the test data generated by the data generator can be controlled by means of an external controller which is not integrated into the semiconductor memory to be tested, but rather can be realized for example in the form of a programmable external test system with a significantly simplified construction compared with the test systems that have been customary heretofore.

Further advantages are afforded if the semiconductor memory according to the invention has a BIST controller which is programmable. In particular, via the programming thereof, it is possible to realize on the one hand the algorithmic manipulation of the start data pattern stored in the shift register and the algorithmic generation of the addresses.

Other features which are considered as characteristic for the invention are set forth in the appended claims.

Although the invention is illustrated and described herein as embodied in a data generator for generating test data for word-oriented semiconductor memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
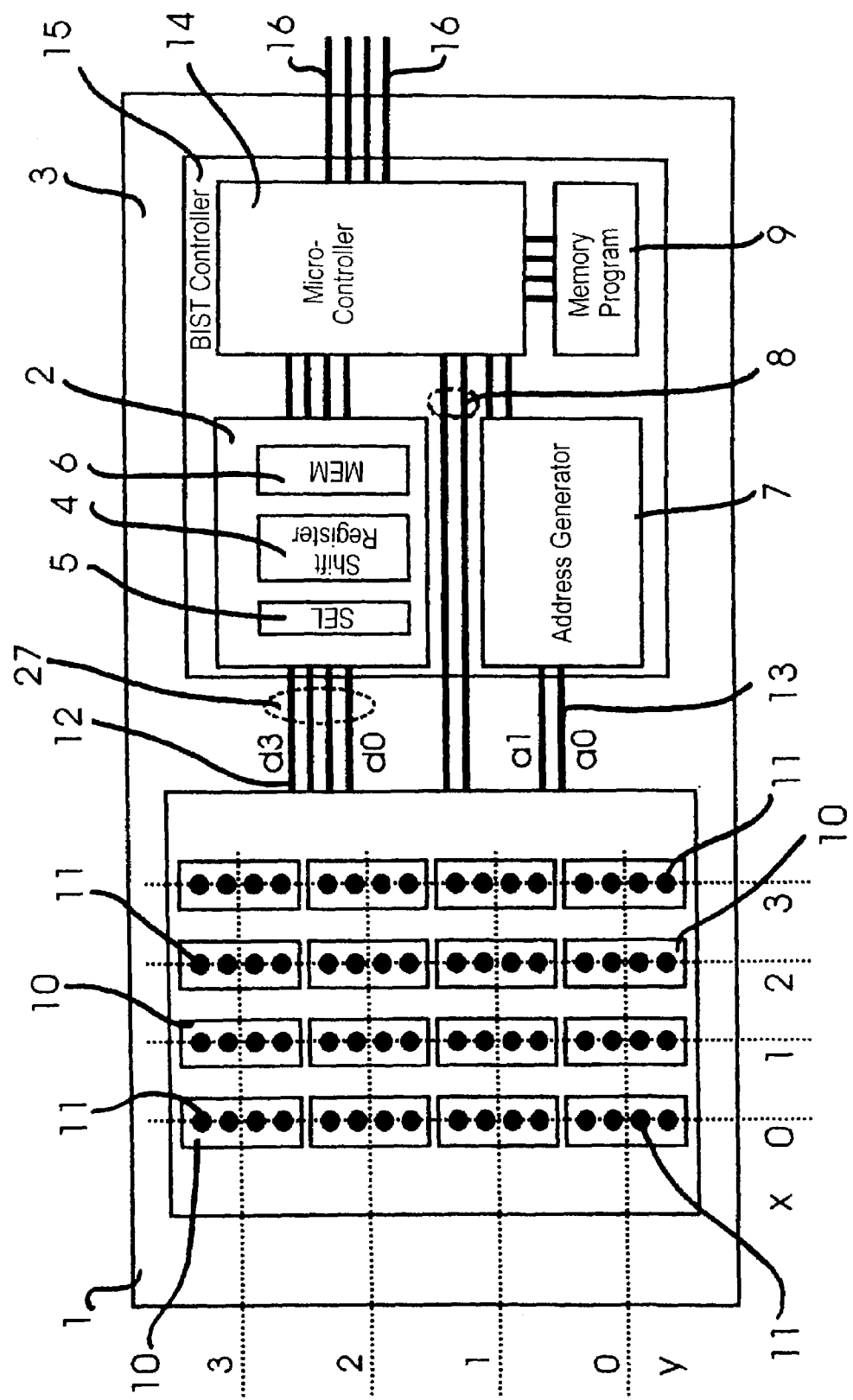
FIG. 1 is a schematic block diagram of a semiconductor memory according to the invention with a data generator integrated onto the semiconductor chip.

Referring now to the figures of the drawing in detail and first, particularly, to FIG. 1 thereof, there is shown a semiconductor memory 1 on a semiconductor chip 3. A multiplicity of memory cells 11 organized in data segments 10 are integrated on the semiconductor chip 3. Each data segment comprises n memory cells 11. The data segments 10 are in turn arranged in a matrix having M columns and N rows. Each data segment is addressed internally via a word line and via n bit lines. Each memory cell 11 can thus be addressed individually.

Externally, a data segment 10 is addressed under an address x (row) and y (column). The addressing is thereby effected via the address lines 13 (a0 to ai). In the illustrated example, the x and the y addresses are multiplexed, i.e. the requisite two x address bits and the requisite two y address bits are transmitted to the semiconductor memory 1 one after the other with corresponding ROW and COLUMN commands via only two address lines 13 (a0, a1).

The memory cells 11 of a data segment 10 can be addressed via the n data lines 12 (d0 to dn-1), the data transmitted via the data lines 12 being applied to the relevant bit lines by means of a multiplex method.

In the illustrated example, N=4 (i.e. 4 rows), M =4 (i.e. 4 columns), i=1 (i.e. two address lines) and n=4 (i.e. 4 memory cells 11 per data segment 10).

A BIST controller 15—comprising a data generator 2, an address generator 7 and a microcontroller 14—is likewise integrated onto the semiconductor chip 3.

The data generator 2 comprises a shift register 4 having the length S. In this case, S is an integer multiple of the word width n of the test data to be generated, in the given case e.g. S=8.

Furthermore, the data generator 2 comprises a selection unit 5, which serves to select four (generally n) data bits, from which the data word to be generated is formed, from the eight (generally S) memory locations (b0 to bS-1) of the shift register.

Moreover, the data generator 2 has a memory unit 6 which comprises a nonvolatile memory. Start data patterns can be stored in this nonvolatile memory, said patterns being read out from the memory unit 6 at the beginning of a test run and being loaded into the shift register 4.

The address generator 7 is provided for addressing the test data having a width of n bits, which are generated by the data generator 2 and are transferred to the semiconductor memory 1 via the data lines 12 (d0 to dn-1), at specific data segments 10. For this purpose, the address generator 7 generates addresses which are transferred via the address lines 13 (a0, a1) to the semiconductor memory 1 and decoded there.

The test data are preferably generated in the data generator 2 on the basis of a predetermined algorithm. Equally, the address data generated by the address generator 7 are also likewise preferably generated on the basis of a predetermined algorithm adapted to the architecture of the semiconductor memory to be tested and, in particular, to the arrangement of the data segments 10. For this purpose, a microcontroller 14 is furthermore integrated, as a constituent part of the BIST controller 15, onto the semiconductor chip 3. The microcontroller 14 is provided for executing a program code on the basis of which a predetermined test algorithm is generated for the semiconductor memory, which comprises the algorithmic generation of test data by the data generator 2 and the algorithmic generation of address data by the address generator 7. Furthermore, the microcontroller 14 is provided for the generation and outputting of control commands for the semiconductor memory 1 (WRITE, READ, etc.). In this case, the control commands for the semiconductor memory 1 are transmitted to the semiconductor memory 1 via a command bus 8.

The microcontroller 14 is furthermore connected to a program memory 9, which is provided for receiving the program code for the microcontroller 14. Finally, the microcontroller 14 can be externally addressed via control lines 16, e.g. for writing in a new program code.

Figure 2:
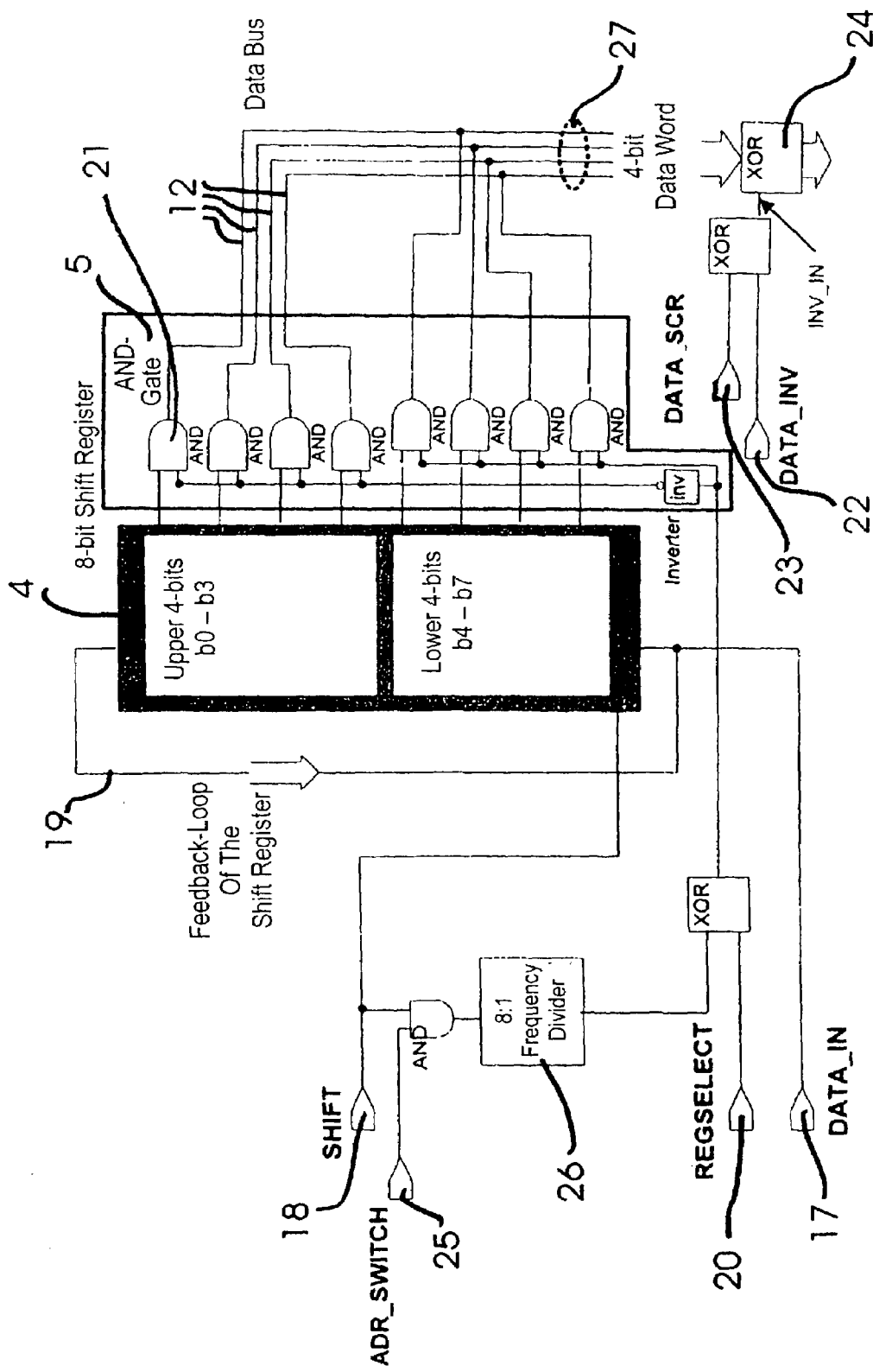
FIG. 2 is a diagram of an exemplary embodiment of a data generator according to the invention.

FIG. 2 schematically shows a possible construction for a data generator 2 according to the invention. For the sake of simplification, it is assumed below that the data generator is provided for generating test data with a word width of 4 bits, which are connected to the semiconductor memory 1 via a data bus 27 having a width of 4 bits, realized by the data lines 12 (d0 to d3).

In the general case, the semiconductor memory 1 is constructed in a word-oriented manner with a word width of n bits. Accordingly, the data generator 2 is connected to the semiconductor memory 1 via a data bus 27 having a width of n bits.

The data generator 2 has a shift register 4 having the length S. In this case, S generally corresponds to an integer multiple of the word width n of the test data to be generated. In the present case, the word width is 4 bits, so that S corresponds to an integer multiple of 4, that is to say e.g. 8, 12, 16, etc. Particular advantages are afforded if S is chosen to be large enough that the data word to be generated can be written to the shift register twice. Consequently, a length S of the shift register of 8 bits results in the present case.

An interaction between different memory cells of the semiconductor memory 1 typically arises not between all the memory cells 11 of a data segment 10, but rather between those memory cells 11 which are directly spatially adjacent or are addressed via directly spatially adjacent bit lines.

For this reason, it is advantageous if the test word to be generated contains a bit pattern which is designed precisely for the testing of interactions between the nearest adjacent memory cells 11 or bit lines. This will generally mean that the critical bit pattern comprises exactly the same number of test bits as is prescribed by the number of memory cells 11 or bit lines which interact with one another. Whether HIGH or LOW bits are used as test bits depends on the actual conditions of the semiconductor memory 1 to be tested (layout, addressed failure mode, etc.).

By way of example, in the case of typical DRAM structures of a memory cell 11, two memory cells 11 are so directly adjacent that an interaction is possible e.g. through capacitive cross talk. Furthermore, in customary DRAM structures, two bit lines are in each case adjacent to a bit line to be tested. In the present case, the generated data word would therefore have to comprise three bits.

In the general case, interactions occur between X adjacent memory cells 11 or bit lines. Since the length S of the shift register 4 is intended to correspond to an integer multiple of the word width n, there results from this, as the optimum length S of the shift register 4, the sum of the number X, rounded up to an integer multiple X* of the word width n, plus n, that is to say:

$$S = X^* + n$$

where X specifies the number of bit lines or memory cells 11 that are to be tested for an interaction to one another. Generally, a shift register length S corresponding to twice the word width n results, i.e.

$$S = 2n.$$

The shift register 4 is connected to the memory unit 6 via a serial data path 17. At the beginning of a test cycle, the start data pattern stored in the memory unit 6 is read into the shift register 4 via the serial data path 17. In this case, the shift register 4 is constructed in such a way that, after each pulse at a shift input 18, the register content is advanced by one register position. In this case, the shift register 4 has a feedback loop 19, via which the most significant bit (b7) is shifted back to the least significant position (b0).

In an advantageous development, the feedback loop 19 is of switchable design, so that the shift direction of the feedback loop 19 can be controlled by means of an external signal.

The shift register 4 has eight outputs via which the content of the register positions b0 to b7 can be read out. These eight outputs are connected to the selection unit 5. The selection unit 5 is provided for selecting, from the eight bits of the register content, four bits which are then read out onto the data bus 27.

In the exemplary embodiment shown, the selection unit 5 comprises 8 AND gates 21. The latter are connected to the outputs of the shift register 4 at their first input and to the selection input 20 at their second input. In this case, the signal of the selection input 20 is present indirectly at the upper four AND gates 21, whereas the signal on the selection input 20 of the lower four AND gates 21 is inverted by means of an inverter. Consequently, by means of the signal applied to the selection input 20, either the upper four bits (b4 to b7) or the lower four bits (b0 to b3) of the shift register 4 can be read out onto the data bus 27. In the present case, only one selection input 20 is necessary since in each case exactly half of the shift register content must be applied to the data bus 27.

In order to avoid data conflicts on the data bus 27, the AND gates 21 are designed in such a way that only one polarity is driven. In the case of the complementary datum (LOW), the output of the gates 21 is switched to a high-impedance state. The data bus 27 must then be precharged to 0 (LOW) before each cycle.

In addition to the concrete configuration of the selection unit 5 that is proposed here, any other configurations which apply n bits from the S bits of the shift register content to the data bus 27 are conceivable. In this case, it is advantageous if the selection unit 5 can be driven via one or a plurality of external lateral lines such as e.g. the selection input 20.

Furthermore, it is possible to provide a data inverter 24 arranged on the data bus 27, said inverter being provided for the bit-by-bit inversion of the data word generated. An inverter input 22 is provided for the driving of the data inverter 24.

Furthermore, a data scrambler may optionally be integrated for example into the algorithmic control of the data generator 2. Said data scrambler generates a HIGH or a LOW signal as a function of the column address x and the row address y of the data segment 10 to be tested. In the exemplary embodiment shown, the signal of the data scrambler on the scrambler input 23 is combined via an exclusive-OR (XOR) with the signal on the inverter input 22. The output signal of the exclusive-OR then controls the data inverter 24.

The data generator 2 described above is thus controlled by means of a shift signal (SHIFT) at the shift input 18, a selection signal (REGSELECT) at the selection input 20, an optional inverter signal (DATA_INV) at the inverter input 22 and an optional scrambler signal (DATA_SCR) at the scrambler input 23. These control signals can now be generated by means of the microcontroller 14 revealed in FIG. 1, using a predetermined test algorithm which is run through by the microcontroller 14 on the basis of the program code stored in the program memory 9.

As an alternative, the driving can also be effected with the aid of an external test system which is likewise provided for the execution of a predetermined test algorithm.

The control signals at the shift input 18 (SHIFT), at the selection input 20 (REGSELECT), at the inverter input (22) (DATA_INV) and at the scrambler input 23 (DATA_SCR) are generated anew in each cycle during the test sequence, e.g. by the microcontroller 14 or an external test system.

With the selection unit 5 described, it is possible to select one of two data patterns from the register content during each cycle. With the aid of the shift functionality of the shift register 4, the start data pattern initially read into the shift register 4 can be shifted algorithmically over all the bit lines or memory cells 11 that are to be tested for interaction. In this case, the test algorithm is to be designed in such a way that, at the end of the test sequence, each individual memory cell 11 or bit line has been tested for entirely satisfactory functioning by itself alone. In addition, each memory cell 11 is intended to have been tested for interaction with adjacent memory cells 11, or each bit line for interaction with adjacent bit lines. In this case, testing is preferably also effected beyond the boundaries of individual data segments 10. This can be implemented by means of corresponding adaptation of the algorithm used.

Furthermore, FIG. 2 shows an optional frequency divider 26 with a frequency divider input 25 (ADR_SWITCH). The frequency divider 26 is provided for inverting the signal on the selection input 20 (REGSELECT) after every fourth shift pulse (SHIFT) on the shift input 18, so that the selection unit 5 automatically changes over between the upper (b4–b7) and the lower (b0–b3) half of the shift register 4. In this exemplary embodiment, in which the shift register 4 merely comprises twice the word width n, the changeover can be realized, as shown, in a simple manner via an exclusive-OR (XOR).

The proposed combination between the shift signal (SHIFT) on the shift input 18 and the selection signal (REGSELECT) on the selection input 20 simplifies the programming of a controller provided for the algorithmic generation of the control signals SHIFT, REGSELECT, etc.

The data generator according to the invention that is proposed here enables flexible data generation and thereby avoids possible limitations in the test coverage.

We claim:

1. A testing device for testing a word-oriented semiconductor memory integrated on a chip, the testing device comprising:
    a data generator for generating test data commonly integrated on the semiconductor chip and connected to the semiconductor memory, and said data generator including a shift resister;
    a selection unit connected to said shift register and configured to select, for a generation of a data word having a width of n bits, a subset of n data bits from a content of said shift register containing S data bits, S being greater than n; and
    the semiconductor memory being configured for storing data words having a width of n bits, and said shift register having a length of S bits, corresponding to an integer multiple of n, n being an integer greater than zero.

2. The testing device according to claim 1, wherein said selection unit is an algorithmically controlled unit.

3. The testing device according to claim 1, which further comprises a memory unit for receiving a start data pattern for said shift register.

4. The testing device according to claim 3, wherein said memory unit has a nonvolatile memory.

5. A word-oriented semiconductor memory device on a semiconductor chip, which comprises:
    a word-oriented semiconductor memory integrated on a semiconductor chip;
    a BIST controller integrated on the semiconductor chip and connected to said semiconductor memory and including a data generator for generating test data for testing said semiconductor memory, said data generator including a shift register;
    a selection unit connected to said shift register and configured to select, for a generation of a data word having a width of n bits, a subset of n data bits from a content of said shift register containing S data bits, S being greater than n; and
    the semiconductor memory being configured for storing data words having a width of n bits, and said shift register having a length of S bits, corresponding to an integer multiple of n, n being an integer greater than zero.

6. The semiconductor memory device according to claim 5, wherein said BIST controller has an address generator for addressing the test data generated by said data generator.

7. The semiconductor memory device according to claim 5, wherein addressing of the test data generated by said data generator is algorithmically controlled by way of a external test system disposed externally of the semiconductor memory device.

8. The semiconductor memory device according to claim 5, wherein said BIST controller is programmable and includes a program memory for receiving program code.

9. In a data generator for generating test data for a word-oriented semiconductor memory, the improvement wherein the data generator is commonly integrated with the semiconductor memory on a common semiconductor chip, and wherein the data generator includes a shift register;
    a selection unit connected to said shift register and configured to select, for a generation of a data word having a width of n bits, a subset of n data bits from a content of said shift register containing S data bits, S being greater than n; and
    the semiconductor memory being configured for storing data words having a width of n bits, and said shift register having a length of S bits, corresponding to an integer multiple of n, n being an integer greater than zero.

* * * * *